(12) United States Patent
Mleczko et al.

(10) Patent No.: US 6,953,559 B2
(45) Date of Patent: Oct. 11, 2005

(54) METHOD FOR PRODUCING HIGHLY PURE, GRANULAR SILICON

(75) Inventors: Leslaw Mleczko, Bochum (DE); Sigurd Buchholz, Köln (DE); Maria Pilar Ezpeleta Tejero, Leverkusen (DE); Felix-Karl Oliver Schlüter, Düsseldorf (DE)

(73) Assignee: Solarworld Aktiengesellschaft, Bonn (DE)

( * ) Notice: Subject to any disclaimer, the term of this patent is extended or adjusted under 35 U.S.C. 154(b) by 122 days.

(21) Appl. No.: 10/450,123

(22) PCT Filed: Nov. 21, 2001

(86) PCT No.: PCT/EP01/13505

§ 371 (c)(1),
(2), (4) Date: Jun. 9, 2003

(87) PCT Pub. No.: WO02/48033

PCT Pub. Date: Jun. 20, 2002

(65) Prior Publication Data

US 2004/0047796 A1  Mar. 11, 2004

(30) Foreign Application Priority Data

Dec. 14, 2000  (DE) .......................................... 100 62 419

(51) Int. Cl.$^7$ ............................................... C01B 33/02
(52) U.S. Cl. ....................................... 423/348; 423/349
(58) Field of Search ................................ 423/348, 349, 423/350, 324

(56) References Cited

U.S. PATENT DOCUMENTS

| | | | |
|---|---|---|---|
| 3,012,861 A | | 12/1961 | Ling |
| 4,207,360 A | * | 6/1980 | Padovani ..................... 427/213 |
| 4,444,811 A | | 4/1984 | Hsu et al. |
| 4,784,840 A | | 11/1988 | Gautreaux et al. |
| 5,139,762 A | | 8/1992 | Flagella |

FOREIGN PATENT DOCUMENTS

| | | |
|---|---|---|
| WO | WO 01/27029 | 4/2001 |

* cited by examiner

*Primary Examiner*—Colleen P. Cooke
(74) *Attorney, Agent, or Firm*—McGlew and Tuttle, P.C.

(57) ABSTRACT

The invention relates to a method for producing highly pure, granular silicon by decomposing a gas containing silicon in a procedure comprising at least two operating states, at least one state comprising the increased formation of nucleus particles from the decomposition of said gas containing silicon and at least one other state comprising the increased separation of the silicon with expansion of the diameter of the silicon granules. The invention also relates to the use of silicon produced in this way and to highly pure, granular silicon particles which are characterised by a coreless structure.

18 Claims, No Drawings

METHOD FOR PRODUCING HIGHLY PURE, GRANULAR SILICON

The present invention relates to a method for producing highly pure granular silicon by decomposition of silicic gases and the use of silicon produced in this way in the photovoltaic area and in semi-conductor technology.

Silicic gases as referred to herein are silicon compounds or mixtures of silicon compounds which under the conditions according to the invention can be decomposed in the gaseous phase depositing silicon. Silicon-free gases in the meaning of this invention are gases which do not contain any silicon compounds.

For the production of elemental silicon with a purity allowing its being used in the photovoltaic area and/or in semi-conductor technology, methods of thermal decomposition of volatile silicon compounds are known. Such thermal decomposition can be carried out, for example, in fluidized-bed reactors in that small silicon particles are provided which are then fluidized by an appropriate silicic gas or gas mixture flowing into the reactor, whereby the gases in the gas mixture can be silicic, but also silicon-free gases. Ideally, the thermal decomposition of such volatile silicon compounds shall occur exclusively on the surface of the small silicon particles are provided. The said small silicon particles provided, hereinafter referred to as nucleus particles, form a large area for the separation of silicon within the reactor. Particles that have grown to a sufficient size are removed from the reactor and new nucleus particles are introduced.

It is known from U.S. Pat. No. 3,012,861 that the decomposition of silane can be carried out on gas containing silicon under underpressure in the reactor and high partial pressures. Surprisingly it was found that when carrying out the reaction under under-pressure, beside of dust (particle diameter Dp=<1 $\mu$m to approx. 25 $\mu$m) and silicon granules (Dp=>100 to <5000 $\mu$m) also a fraction of small particles (Dp=25 to <100 $\mu$m) is produced which remains in the fluidized bed. During the reaction silicon deposits also on this particle fraction, i.e. such particles act as nucleus particles. Such particles make the addition of nucleus particles with a small diameter unnecessary. This minimizes the risk of contamination of high-purity silicon by and due to the addition of nucleus particles thereby facilitating the method as expensive dosing systems are not required. Furthermore the method can easily be used in a continuous process.

It also showed, however, that during continuous production of nucleus particles during the reaction in the reactor an accumulation of fine nucleus particles occurs when the formation rate of small particles is higher than the rate of particles of the desired size being carried away, i.e. if new particles are formed faster than particles can grow due to the decomposition of silicon and reach a defined size. Since due to their smaller diameter small nucleus particles have a higher specific surface (in relation to their weight) than the expanded granules this results in a very wide variety of particle sizes and a permanently increasing percentage of nucleus particles.

U.S. Pat. No. 4,314,525 A teaches a method for the production of highly pure silicon. Silicon seed particles are produced in a first fluidized bed reactor by thermal decomposition of silicon containing gas. These seed particles are then introduced into a second fluidized bed reactor where they are fluidized. Silicon containing gas is led into the reactor and thermally decomposed, whereby separation of silicon with expansion of the seed particles takes place.

U.S. Pat. No. 4,784,840 describes the use of silicon for the production of semiconductors.

The object of the present invention was to provide a reaction method allowing a controlled production of nucleus particles in the reaction chamber without occurrence of the above specified accumulation.

The formation rate of the above specified nucleus particles during the decomposition of silicic gas in a fluidized-bed reactor depends strongly on the selected reaction conditions, particularly the partial pressure of silane, the total pressure, the accessory fluidizing gas, the gas velocity and the reaction temperature. Surprisingly it was found that the object is achieved by a reaction method comprising at least two operating states, at least one state comprising the increased formation of nucleus particles from the decomposition of said gas containing silicon and at least one other state comprising the increased separation of the silicon with expansion of the diameter of the silicon granules.

Subject-matter of the invention is therefore a method for the manufacture of highly pure granular silicon by thermal decomposition of a gas containing silicon, characterized in that the reaction method comprises at least two operating states, wherein
  a) one state comprises the increased formation of nucleus particles from the thermal decomposition of said gas containing silicon, and
  b) at least one other state comprises the mainly occurring separation of the silicon with expansion of the diameter of such particles.

Preferably the manufacture of granular silicon is carried out so that
  a) in one operating state the partial pressure of the gas containing silicon is>200 mbar and
  b) in at least one other operating state the partial pressure of the gas containing silicon is<200 mbar.

The partial pressure of the silicic gas can be influenced both by adjusting the total pressure as well as by adjusting the concentration of silicic gas in the gas stream introduced in the reactor.

The operating states can immediately be passed cyclically one after the other. It is also possible, however, to interrupt said operating states a) and b) by one or several other operating states.

Such other operating states can be, for example, rinsing with inert gases or reactive gases, increase or reduction of temperature, modification of the concentration of silicic gas, modification of gas velocity, addition of further silicic gasses or addition or removal of particles.

The method according to the invention can be carried in different types of reactors. Appropriate reactors, particularly fluidized-bed reactors are already known. The application of a fluidized-bed reactor is preferred. By way of example reactors providing a bubbling or circulating fluidized bed may be mentioned, further spouted bed reactors, moving bed reactors and downpipe reactors.

The method can be carried out, for example, continuously or discontinuously. A continuous process is preferred. The silicon particles formed by separation can be carried out of the reactor continuously or discontinuously. In the method according to the invention the loss of particles due to product being carried out of the reactor is replaced by the in situ generation of new nucleus particles. It is also possible, however, to add additional nucleus particles. These additional nucleus particles can be added continuously or intermittingly. Silicic gasses to be employed can be silanes, silicon iodides and halosilanes of chlorine, bromine and iodine. Also mixtures of the named compounds can be employed. It is irrelevant whether the silicon compound is already rendered in gaseous form at room temperature or needs to be transformed into gaseous condition first. The transformation to gaseous condition can be carried out thermally for example.

The use of silanes is preferred. By way of example $SiH_4$, $Si_2H_6$, $Si_3H_8$, $Si_4H_{10}$ and $Si_6H_{14}$ may be named. Particularly preferred is $SiH_4$.

It is possible to carry out the method according to the invention for the manufacture of highly pure granular silicon by adding a silicon-free gas or a mixture of several silicon-free gasses. For example, the amount of silicon-free gas added can be 0 to 98 volume percent based on the total amount of gas introduced. Adding silicon-free gas or a mixture of silicon-free gasses has an impact on the formation of silicon dust upon thermal decomposition of the silicic gas. It is also possible, however, to do without any addition of silicon-free gas.

Suitable silicon-free gasses are, for example, noble gasses, nitrogen and hydrogen, the silicon-free gasses being applicable each gas individually or any combination of them. Nitrogen and hydrogen are preferred, particularly preferred is hydrogen.

Temperature can be varied in the temperature range from 300° C. to 1400° C. The temperature must be high enough, however, to ensure the decomposition of the silicic gas and must not exceed the melting temperature of the produced silicon. In case of $SiH_4$ being used the advantageous temperature range is between 500° C. and 1400° C. A decomposition temperature from 600° C. to 1000° C. is preferred, particularly preferred 620° C. to 800° C. In case of $SiI_4$ being used the respective range is between 850° C. and 1250° C., for halosilanes between 500° C. and 1400° C.

In a particular embodiment of the method according to the invention the silicic gas used is $SiH_4$ and the process is carried out at temperatures from 500° C. to 1400° C.

In a preferred embodiment of the method according to the invention solid particles are provided in the reaction zone of a fluidized-bed reactor, hereinafter referred to as particles. The particles form a fixed bed through to which the introduced gas is streamed. The stream-in velocity of the introduced gas is adjusted such that the fixed bed is fluidized and a fluidized bed develops. The respective procedure is generally known to the skilled person. The stream-in velocity of the introduced gas must correspond to at least the loosening velocity. Loosening velocity in this case is to be understood as the velocity at which a gas streams through a bed of particles and below which the fixed bed is maintained, i.e. below which the bed particles remain largely fixed. Above this velocity the bed starts fluidizing, i.e. the bed particles move and bubble begin to emerge.

The stream-in velocity of the introduced gas in this preferred embodiment is one to ten times the loosening velocity, preferably one and a half to seven times the loosening velocity.

Preferably particles of a diameter of 50 to 5000 $\mu$m are used.

The particles used are preferably silicon particles. Preferably such silicon particle have a purity corresponding to the one desired for the produced highly pure granular silicon. It is also possible, however, to use silicon particles with a certain doping level if doped material is desired.

The method according to the invention can be carried out such that, for example, the concentration of silicic gas is maintained constant and the operating states to be passed according to the invention are adjusted by modification of the total pressure. Preferably the concentration of silicic gas is 10 to 100 volume percent, particularly preferred 50 to 100 volume percent, based on the total amount of gas introduced in the reactor. It is also possible to carry out the method according to the invention such that the total pressure is maintained constant and the operating states to be passed according to the invention are adjusted by modification of the concentration of silicic gas. Preferably the total pressure is 100 to 2000 mbar, particularly preferred 400 to 1200 mbar. All pressure values specified refer to the absolute pressure. If the method according to the invention is carried out in a fluidized-bed the pressure values specified above are to be understood as the pressure prevailing behind the fluidized bed as seen in flow direction of the introduced gas mixture.

Of course the operating states to be passed according to the invention can also be adjusted by modification of the total pressure and the concentration of silicic gas.

Preferably the reaction is carried out maintaining a constant concentration of silicic gas and varying the total pressure.

It must be taken into account, that particularly depending on the selected silicic gas and temperature, there is a range of total pressure and concentration of silicic gas where the amount of nucleus particles formed achieves a maximum. Such ranges can be determined by way of experiment.

If, for example, silane $SiH_4$ is reacted as silicic gas in a concentration of 90 to 100 volume percent at a temperature from 650 to 700° C., provided a constant concentration of silane the maximum amount of nucleus particles is achieved at a total pressure of approx. 600 to 700 mbar and reduces with further increase of pressure. Preferably the operating state comprising the increased formation of nucleus particles from the thermal decomposition of said gas containing silicon, is therefore in this case carried out in the respective pressure range.

Since the rate of formation of nucleus particles can be controlled by the reaction conditions selected, different operating modes are combined in the method according to the invention, on the one hand to generate nucleus particles in situ, and on the other hand to avoid an accumulation of nucleus particles. Adding hydrogen to the silicic gas introduced in the reactor where the thermal decomposition occurs leads to an increased formation of nucleus particles, provided that a partial pressure above 200 mbar is given in the silicic gas. It is preferred therefore to carry out the method according to the invention such that during the operating state comprising the increased formation of nucleus particles hydrogen is added to the silicic gas.

Besides the above specified technical advantages the method according to the invention distinguishes itself also in that the silicon particles obtained due to formation of silicon on nucleus particles generated in situ provide a spherical, coreless structure. Coreless structure in this sense means that the said silicon particles provide a homogenous structure all over the corn volume. If the thermal decomposition of a silicic gas, however, occurs in the known way on nucleus particles which were not generated in situ, the silicon particle formed does not provide a homogenous structure, but the separated silicon forms a layer around a core, namely the nucleus particle employed. When investigating the cross-section of such a silicon particle by means of a surface electron microscope, the transition from the said nucleus particle to the epitaxially grown silicon is clearly visible. A silicon particle generated in accordance with the inventive method, however, does not provide such a transition.

The coreless silicon particles to be produced according to the inventive method provide advantageous breaking, flow and melting properties. Particularly the melting properties are especially important for a further processing of silicon particles, e.g. for the manufacture of multicrystalline silicon blocks or silicon dices.

Further subject-matter of the invention are therefore highly pure, granular silicon particles which are characterized by a coreless structure.

Preferably such highly pure, granular silicon particles are produced according to the inventive method.

The silicon produced according to the inventive method can be used, for example, in the photovoltaic area and for the manufacture of electronic components.

The following examples are provided as illustrations of potential operating states of the method according to the invention—but not limiting the invention to them. Percentages given in the examples shall be weight percent, unless otherwise specified.

EXAMPLE 1

Controlling the Formation of Nucleus Particles by Means of the Partial Pressure of Silane In an experimental fluidized-bed reactor (diameter=52.4 mm, height with head extended=1600 mm), 800 g of silicon particles with an average diameter of 338 μm were provided. The experiment was carried out at a pressure of 500 mbar. After start-up and heating of the fluidized bed to a temperature of 680° C. in nitrogen, the silane concentration ($SiH_4$) at the entrance of the reactor was adjusted from 0 to 100 volume percent based on the total amount of silane and nitrogen introduced. The experiment, hereinafter referred to as V1, was continued until the particles had grown from an average diameter of 338 to 360 μm due to the deposition of silane ($SiH_4$). The particles were allowed to cool and then discharged from the reactor Then the selectivities for the formation of CVD silicon, nucleus particles and dust were determined by means of a weight assessment. Altogether 466.9 g silicon were separated. The selectivities obtained during this process are specified in Table 1, the selectivity for the formation of nucleus particles was 4.6%.

In another experiment (V2) 800 g of silicon particles with an average diameter of 346 μm were provided, the total pressure in the reactor was increased to 650 mbar and the experiment carried out as specified above. 635.2 g silicon were separated, resulting in an increase of the average diameter of particles from 346 to 384 μm. The selectivity for the formation of nucleus particles increased to 24.4%.

Another increase of the partial pressure of silane to 700 mbar in experiment V3 lead again to a reduction of the selectivity to nucleus particles to 16.8%.

The example illustrates clearly the influence of total pressure on the product distribution when the percentage of silicic gas in the total amount of gas introduced remains constant.

TABLE 1

|    | $P_{tot}$, mbar | $x_{SiH4}$, v/v % | $S_{CVD}$, % | $S_{NucPart}$, % | $S_{Dust}$, % |
|----|-----|-----|------|------|------|
| V1 | 500 | 100 | 75.9 | 4.6  | 19.5 |
| V2 | 650 | 100 | 62.5 | 24.4 | 13.1 |
| V3 | 700 | 100 | 71.1 | 16.8 | 12.1 |

$P_{tot}$: Total pressure
$x_{SiH4}$: percentage of $SiH_4$ in the introduced gas stream
$S_{CVD}$: selectivity for the formation of CVD silicon
$S_{NucPart}$: selectivity for the formation of nucleus particles
$S_{Dust}$: selectivity for the formation of dust

EXAMPLE 2

Controlling the Formation of Nucleus Particles by Means of the Partial Pressure of Hydrogen In an experimental fluidized-bed reactor (diameter=52.4 mm, height with head extended=1600 mm), 800 g of silicon particles with an average diameter of 334-345 μm were provided. The experiment was carried out at pressures of 500 mbar (V1, V4, V5) and 650 mbar (V6). After start-up and heating of the fluidized bed to a temperature of 680° C. in nitrogen, the silane concentration ($SiH_4$) at the entrance of the reactor was adjusted from 0 to 100 volume percent based on the total amount of silane and nitrogen introduced. Then a concentration of hydrogen was adjusted in each experiment such that the partial pressures for hydrogen specified in Table 2 were achieved and the reaction was carried out the particles which had grown from an average diameter of 334-345 μm to 356-383 μm due to the deposition of silane ($SiH_4$). The grown particles were allowed to cool and were then discharged from the reactor. Then the selectivities for the formation of CVD silicon, nucleus particles and dust were determined by means of a weight assessment (Table 2). It showed that with an increasing partial pressure of hydrogen the selectivity for the formation of nucleus particles increased from 4.6% to 20.8%. So the formation of nucleus particles can be increased by a metered addition of hydrogen.

When the partial pressures of silane are low, i.e. below 200 mbar, the selectivity to nucleus particles decreases, however, despite high partial pressures of hydrogen.

TABLE 2

|    | $P_{tot}$, mbar | $P_{SiH4}$, mbar | $P_{H2}$, mbar | $S_{CVD}$, % | $S_{NucPart}$, % | $S_{Dust}$, % |
|----|-----|-----|-----|------|------|------|
| V1 | 500 | 500 | 0   | 75.9 | 4.6  | 19.5 |
| V4 | 500 | 450 | 50  | 72.3 | 8.2  | 19.5 |
| V5 | 500 | 400 | 100 | 69.8 | 13.4 | 16.8 |
| V6 | 650 | 450 | 200 | 66.9 | 20.8 | 12.3 |

$P_{tot}$: Total pressure
$P_{SiH4}$: partial pressure of $SiH_4$ in the introduced gas stream
$P_{H2}$: partial pressure of $H_2$ in the introduced gas stream
$S_{CVD}$: selectivity for the formation of CVD silicon
$S_{NucPart}$: selectivity for the formation of nucleus particles
$S_{Dust}$: selectivity for the formation of dust

EXAMPLE 3

Operating state for the formation of nucleus particles

In an experimental fluidized-bed reactor (diameter=52.4 mm, height with head extended=1600 mm), 810 g of silicon particles with an average diameter of 284 μm were provided. The experiment was carried out at a pressure of 500 mbar. After start-up and heating of the fluidized bed to a temperature of 680° C. in nitrogen, the silane concentration ($SiH_4$) in Experiment V7 at the entrance of the reactor was adjusted from 0 to 100 volume percent based on the total amount of silane and nitrogen introduced. After the particles had grown from an average diameter of 284 μm to 333 μm due to the deposition of silane ($SiH_4$) they were allowed to cool and were then discharged from the reactor. Then the selectivities for the formation of CVD silicon, nucleus particles and dust were determined by means of a weight assessment (Table 3).

Subsequently a representative sample of 800 g of silicon particles formed in Experiment V7 were subjected to a pyrolysis process again under the same conditions (V8). The average diameter of the particles grew from 333 μm to 361 μm. The selectivity to nucleus particles increased from 22.8% in V7 to 44.8% (Table 3).

The selected reaction conditions lead therefore to an accumulation of nucleus particles in the fluidized bed, wherein the nucleus particles grew from an average of 45 μm according to V7 to 72 μm according to V8. So both the number as well as the size of the nucleus particles increase with increasing period of operation.

TABLE 3

|  | $P_{tot}$, mbar | $P_{SiH4}$, mbar | $S_{CVD}$, % | $S_{NucPart}$, % | $S_{Dust}$, % |
|---|---|---|---|---|---|
| V7 | 500 | 500 | 64.3 | 22.8 | 12.9 |
| V8 | 500 | 500 | 38.9 | 44.8 | 16.3 |

$P_{tot}$: Total pressure
$x_{SiH4}$: percentage of $SiH_4$ in the introduced gas stream
$S_{CVD}$: selectivity for the formation of CVD silicon
$S_{NucPart}$: selectivity for the formation of nucleus particles
$S_{Dust}$: selectivity for the formation of dust

EXAMPLE 4

Operating State for Increased Expansion of Nucleus Particles

In an experimental fluidized-bed reactor (diameter=52.4 mm, height with head extended=1600 mm), 890 g of silicon particles with an average diameter of 345 μm were provided. The experiment (V9) was carried out at a pressure of 500 mbar. After start-up and heating of the fluidized bed to a temperature of 680° C. in hydrogen, the silane concentration ($SiH_4$) at the entrance of the reactor was adjusted from 0 to 10 volume percent based on the total amount of silane and nitrogen introduced, and the reaction was carried out until the particles had grown from an average diameter of 345 μm auf 366 μm due to the deposition of silane ($SiH_4$). The particles were allowed to cool and were then discharged from the reactor. Then the selectivities for the formation of CVD silicon, nucleus particles and dust were determined by means of a weight assessment (Table 4). No formation of nucleus particles occurred.

TABLE 4

|  | $P_{tot}$, mbar | $x_{SiH4}$, v/v % | $S_{CVD}$, % | $S_{NucPart}$, % | $S_{Dust}$, % |
|---|---|---|---|---|---|
| V9 | 500 | 10 | 88.6 | 0.0 | 11.4 |

$P_{tot}$: Total pressure
$x_{SiH4}$: percentage of $SiH_4$ in the introduced gas stream
$S_{CVD}$: selectivity for the formation of CVD silicon
$S_{NucPart}$: selectivity for the formation of nucleus particles
$S_{Dust}$: selectivity for the formation of dust

What is claimed is:

1. A method for the manufacture of granular silicon by thermal decomposition of a gas containing silicon, characterized in that the reaction method comprises:
   a) providing at least two operating states in a single reactor, wherein
   b) one state comprises an increased formation of nucleus particles from the thermal decomposition of said gas containing silicon, and
   c) another state comprises a mainly occurring separation of the silicon with expansion of the diameter of such particles, wherein said reaction method comprises at least two operating states, wherein
   d) in one operating state the partial pressure of the gas containing silicon is >200 mbar, and
   e) in another operating state, the partial pressure of the gas containing silicon is <200 mbar, wherein said two operating states occur in same single reactor.

2. A method according to claim 1, wherein said operating states b) and c) are interrupted by one or several other operating states.

3. A method according to claim 2, wherein said other operating states are rinsing with at least one of inert gases and reactive gases, one of increase and reduction of temperature, modification of a concentration of silicic gas, modification of gas velocity, at least one of addition of further silicic gases, and addition of particles, and removal of particles.

4. A method according to claim 1, wherein said thermal decomposition of a silicic gas is carried out in the presence of a plurality of particles through which an introduced gas streams in a way such that said particles are fluidized and a fluidized bed develops.

5. A method according to claim 4, wherein said particles used are silicon particles.

6. A method according to claim 4, wherein said particles have a diameter between 50 and 5000 μm.

7. A method according to claim 4, wherein a streaming velocity of said introduced gas stream adopts values from 1 to 10 in relation to the loosening velocity.

8. A method according to claim 1, wherein an additional addition of nucleus particles and a discharge of the silicon produced are carried out continuously or intermittingly.

9. A method according to claim 1, wherein a silicic gas used for said method is a silane.

10. A method according to claim 1, wherein a silicic gas used for said method is $SiH_4$ and that a reaction of said reaction method is carried out at temperatures from 500 to 1400° C.

11. A method for manufacturing granular silicon, said method comprising:
    providing a single reactive zone in a reactor;
    introducing a gas containing silicon into said single reactive zone;
    establishing a bifurcating environment including at least one of a first partial pressure of said gas containing silicon at >200mbar and a second partial pressure of said containing silicon at <200 mbar;
    thermally decomposing said gas containing silicon,
    providing a first operating state including an increased formation of a plurality of nucleus particles from said thermal decomposition in said single reactive zone; and
    providing a second operating state including a mainly occurring separation of the silicon with expansion of the diameter of said nucleus particles in said single reactive zone.

12. A method according to claim 11, wherein said first and second operating states or said bifurcating environment are interrupted by an operating state of rinsing with at least one of inert gases and reactive gases, or increase and reduction of temperature, modification of a concentration of silicic gas, modification of gas velocity, addition of further silicic gases, addition of particles, and removal of particles.

13. A method according to claim 11, wherein said thermal decomposition of a silicic gas is carried out in the presence of said nucleus particles by introducing gas streams so that said nucleus particles are fluidized and a fluidized bed developed, wherein said nucleus particles used are silicon particles.

14. A method according to claim 13, wherein said nucleus particles have a diameter between 50 and 5000 μm.

15. A method according to claim 13, wherein a streaming velocity of said introduced gas stream adopts a value from 1 to 10 in relation to the loosening velocity.

16. A method according to claim 11, wherein an additional nucleus particles and a discharge of said silicon produced are carried out continuously or intermittently.

17. A method according to claim 11, wherein a silicic gas used for said method is a silane.

18. A method according to claim 11, wherein a silicic gas used for said method is $SiH_4$ and a reaction of said reaction method is carried out at temperatures from 500 to 1400° C.

* * * * *